(12) United States Patent  (10) Patent No.: US 7,613,047 B2
Fales et al.  (45) Date of Patent: Nov. 3, 2009

(54) EFFICIENT CIRCUIT AND METHOD TO MEASURE RESISTANCE THRESHOLDS

(75) Inventors: Jonathan R. Fales, South Burlington, VT (US); John A. Gabric, Essex Junction, VT (US); Muthukumarasamy Karthikeyan, Fishkill, NY (US); Jeffery H. Oppold, Richmond, VT (US)

(73) Assignee: International Business Machines Corporation, Armonk, NY (US)

( * ) Notice: Subject to any disclaimer, the term of this patent is extended or adjusted under 35 U.S.C. 154(b) by 308 days.

(21) Appl. No.: 11/538,945

(22) Filed: Oct. 5, 2006

(65) Prior Publication Data

US 2008/0084760 A1  Apr. 10, 2008

(51) Int. Cl.
*G11C 16/06* (2006.01)
(52) U.S. Cl. ............... 365/185.23; 365/185.21; 365/185.24; 365/148; 365/205; 365/207; 327/51; 327/52; 327/57
(58) Field of Classification Search ............ 365/185.21, 365/185.23, 185.24, 148, 205, 207; 327/51, 327/52, 57
See application file for complete search history.

(56) References Cited

U.S. PATENT DOCUMENTS

| 5,519,629 | A | | 5/1996 | Snider |
| 5,638,333 | A | * | 6/1997 | Lee ............................. 365/205 |
| 5,696,717 | A | * | 12/1997 | Koh ....................... 365/185.22 |
| 5,706,234 | A | | 1/1998 | Pilch, Jr. et al. |
| 6,191,989 | B1 | * | 2/2001 | Luk et al. ................... 365/207 |
| 6,366,497 | B1 | * | 4/2002 | Guliani et al. ......... 365/185.21 |
| 6,373,994 | B1 | | 4/2002 | Anderson |
| 6,438,051 | B1 | * | 8/2002 | Fifield et al. ............... 365/207 |
| 6,490,702 | B1 | | 12/2002 | Song et al. |
| 6,609,242 | B1 | | 8/2003 | Slade |
| 6,752,763 | B2 | | 6/2004 | Erikson |
| 6,880,136 | B2 | | 4/2005 | Huisman et al. |
| 6,886,142 | B2 | | 4/2005 | Yokota et al. |
| 7,307,911 | B1 | * | 12/2007 | Anand et al. ............. 365/225.7 |
| 2005/0201171 | A1 | * | 9/2005 | Choi et al. ................. 365/205 |
| 2007/0036008 | A1 | * | 2/2007 | Park et al. ............. 365/189.09 |

\* cited by examiner

*Primary Examiner*—Van Thu Nguyen
*Assistant Examiner*—Eric Wendler
(74) *Attorney, Agent, or Firm*—Gibb I.P. Law Firm, LL; Michael LeStrange, Esq.

(57) ABSTRACT

The embodiments of the invention provide an apparatus, method, etc. for an efficient circuit and method to measure resistance. A sense line driver for an integrated circuit memory is provided, including a sense node that receives an experiment signal from an experiment structure. An output device is connected to the sense node, wherein the output device amplifies the experiment signal. Further, a voltage divider is connected to the sense node, wherein the voltage divider includes a first device and a second device. A sensing range is controlled by an operating width/resistance range and/or an adjust signal of the second device. The adjust signal changes a gate to source voltage of the second device and holds a constant voltage over multiple sensing instances. The sensing range is different for each of the sensing instances due to a change in the operating width of the second device.

17 Claims, 3 Drawing Sheets

EFFICIENT CIRCUIT AND METHOD TO MEASURE RESISTANCE THRESHOLDS

BACKGROUND

1. Field of the Invention

The embodiments of the invention provide an apparatus, method, etc. for an efficient circuit and method to measure resistance thresholds of semiconductor devices or any of the structures related to their processing in silicon or metallization layers.

2. Description of the Related Art

As technology is improving, the performance gap between memory and CPU is increasing. This results in the need for faster and bigger on-chip memories. A component in the periphery of the memory is a sense amplifier which amplifies a small signal variation in the bitlines. Since the sense amplifier is in the path of the memory, it has a significant impact on the performance of the memory.

Sense amplifiers tend to be very complex such that they are very difficult to manufacture due to device mismatches. They become especially difficult early on in technology development when the processing isn't running as cleanly as it will in some time. Unfortunately, it is the learning during this early poor processing that is most valuable in fixing the processing. To solve this problem it requires a robust sense amplifier that won't require such complexity as to render it useless in a poor process; rather, embodiments herein are willing to balance granularity of information against a volume of reliable information.

SUMMARY

The embodiments of the invention solve the problem of slow defect diagnosis turn around times especially in new hardware, existing area inefficient defect density monitors (significant cost reduction in technology development), and inflexible and complicated circuits to determine defect density and yield numbers. The idea is that the company who can do defect detection and diagnosis the fastest will reduce cost and have a strategic advantage in technology development. Embodiments herein provide the vehicle for that advantage.

The embodiments of the invention provide the best circuit solution to slow defect diagnosis and technology development inefficiency. An array architecture enables FA to find the exact problem area quickly (in some cases, less than 1 day turn-around-time back to manufacturing).

The embodiments of the invention provide an apparatus, method, etc. for an efficient circuit and method to measure resistance thresholds of semiconductor devices or any of the structures related to their processing in silicon or metallization layers. A sense line driver (also referred to herein as "sense amplifier") for an integrated circuit memory is provided, including a sense node that receives an experiment signal from an experiment structure. An output device is connected to the sense node, wherein the output device amplifies the experiment signal. Further, a voltage divider is connected to the sense node, wherein the voltage divider includes a first device and a second device. A sensing range of the sense line driver (sense amplifier) is controlled by an operating width/resistance range and/or an adjust signal of the second device. It is recognized that the second device could be a stacked transistor, potentiometer, or the like.

The adjust signal changes a gate to source voltage of the second device and holds a constant voltage over multiple sensing instances. The second device could be any number of semiconductor devices per the requirements of the voltage divider and experiment setup. The sensing range is different for each of the sensing instances due to a change in the operating width/resistance range of the second device.

Additionally, the sense line driver includes a third device, a fourth device and a fifth device. Specifically, the third device is connected to the sense node and allows a drive signal connected to the first device and the third device to propagate through the sense node to the output device (or other "not selected" propagation scheme) when a gate signal connected to the experiment structure is off. The fourth and fifth devices are connected to the adjust signal, wherein the fourth and fifth devices latch the sense line driver. It is recognized that other feedback mechanisms could replace the fourth and fifth devices.

A method is also provided for measuring resistance (ranges, categories, thresholds) of an integrated circuit device using a sense line driver. The method begins by forming a voltage divider network that includes a first device and a second device. A sensing range is controlled by an operating width/resistance range and/or an adjust signal of the second device. The adjust signal is held at a constant voltage over multiple sensing instances, wherein the sensing range is differed for each of the sensing instances by changing the operating width/resistance range of the second device. The method further includes changing a gate to source voltage of the second device via the adjust signal; propagating a drive signal to an output device when a gate signal connected to an experiment structure is off; and, latching the sense line driver.

Accordingly, the embodiments of the invention provide a sense amplifier based on a voltage divider scheme, which replaces typical differential amplifier circuits that normally give great detailed information after significant design, test, and manufacturing effort. This circuit is an efficient way to acquire a large amount of information quickly, particularly statistical, over a wide range of resistances (resistance tiers or thresholds) due to the width of the second device, and therefore the voltage divider of the first transistor device-second transistor device and the access device-experiment device.

These and other aspects of the embodiments of the invention will be better appreciated and understood when considered in conjunction with the following description and the accompanying drawings. It should be understood, however, that the following descriptions, while indicating preferred embodiments of the invention and numerous specific details thereof, are given by way of illustration and not of limitation. Many changes and modifications may be made within the scope of the embodiments of the invention without departing from the spirit thereof, and the embodiments of the invention include all such modifications.

BRIEF DESCRIPTION OF THE DRAWINGS

The embodiments of the invention will be better understood from the following detailed description with reference to the drawings, in which.

DETAILED DESCRIPTION OF PREFERRED EMBODIMENTS

Figure 1:
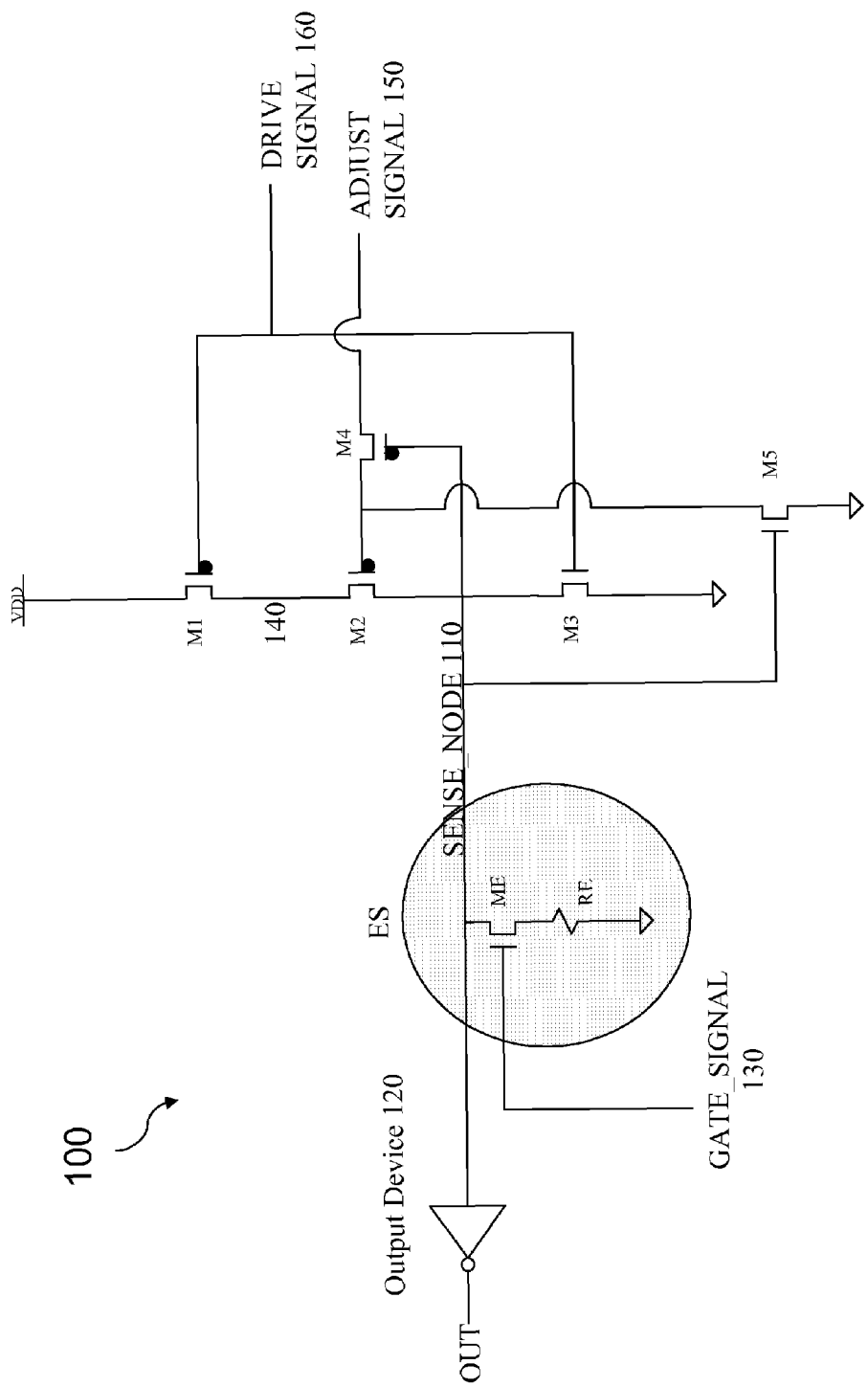
FIG. 1 illustrates a sense line driver for an integrated circuit memory.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

The embodiments of the invention provide a sense amplifier based on a voltage divider scheme, which replaces typical differential amplifier circuits that normally give great detailed information after significant design, test, and manufacturing effort. This circuit is an efficient way to acquire a large amount of information quickly, particularly statistical, over a wide range of resistances due to the width of the second transistor device, and therefore the voltage divider of the first transistor device-second transistor device and the access device-experiment device. For example, how many experiments are over 100 kohms? How many are over 1 kohm?

Referring now to FIG. 1, a sense amplifier 100 examines an experimental structure ES, wherein the experimental structure ES includes a resistive experiment RE and an access device ME. The resistive experiment RE can be anything intended to be an open or a short circuit. For example, two wires placed next to each other without a processing defect would look like an open, and with a processing defect would look like a short. Any combination of semiconductor processing levels, structures, or devices could be the resistive experiment RE.

The circuit topology of this apparatus enables an array architecture to access and evaluate the resistive experiment RE. This is provided by the access device ME, which serves to allow the signal across the resistive experiment RE (also referred to herein as the "experiment signal") to be present on a SENSE_NODE 110. The placement of the resistive experiment RE at a ground node allows for the most efficient topology and other inline tests such as voltage contrast tests on the resistive experiment RE. The access device ME can be between the SENSE_NODE 110 and the resistive experiment RE, wherein a GATE_SIGNAL 130 is connected to the access device ME.

The sense amplifier 100 further includes a first device M1, a second device M2, a third device M3, a fourth device M4, and a fifth device M5. The experiment structure ES and the SENSE_NODE 110 can be positioned between an output device 120 and the devices M1-M5. The devices M1-M5 could be transistors. As illustrated in FIG. 1, the first device M1 can be positioned between a supply voltage VDD and the second device M2, wherein the second device M2 is positioned between the first device M1 and the third device M3. A drive signal 160 could be connected to the first device M1 and the third device M3. Moreover, the fourth device M4 can be positioned adjacent the second device M2, wherein the fifth device M5 is connected to the fourth device M4. An adjust signal 150 can be connected to the second device M2, the third device M3, the fourth device M4, and the fifth device M5.

If the devices M1-M5 are replaced with the inverter like output device 120, which drives the SENSE_NODE 110 high, and if the GATE_SIGNAL 130 turns the access device ME on, the resistive experiment RE is evaluated and its information is transferred through the access device ME to the SENSE_NODE 110. The output device 120 then amplifies the information to the outside world through signal OUT.

The devices M1 and M2 combine to form a resistor 140 from the SENSE_NODE 110 to the supply voltage VDD, wherein the resistance of the resistor 140 can be controlled through the adjust signal 150 and/or the width of the device M2. This forms a voltage divider from the supply voltage VDD through the resistor 140 through the access device ME and the experiment device RE to the ground node.

The adjust signal 150 can be held at a constant voltage (typically between GND and VDD) for multiple instances of the sense amplifier 100 that have different device M2 widths per instance. This way, each instance has a different resistance sensing range due to the change in the resistor 140 through the width of the device M2. Further, the adjust signal 150 can change to vary the gate to source voltage of the device M2 and also change the resistance sensing range. For example, a width of 2 um on the device M2 might trip at 10 kohms, whereas a width of 0.5 um might trip at 100 kohms. The adjust signal 150 can then move the trip points up and down as needed.

Figure 2:
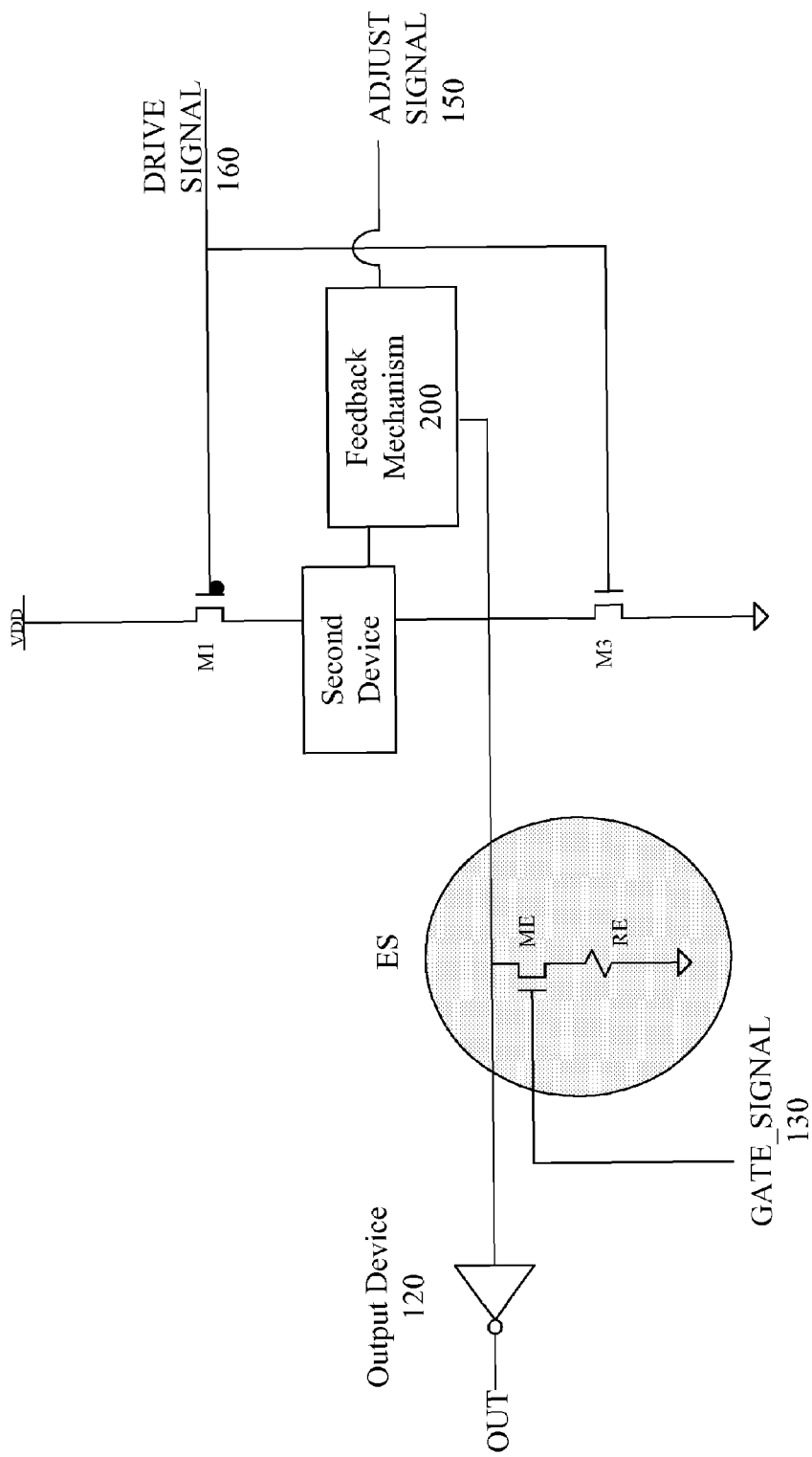
FIG. 2 illustrates another sense line driver for an integrated circuit memory.

The devices M5 and M4 act as a feedback mechanism for latching the sense amplifier 100 once it is tripped, or has reached its set point. This also keeps the sense amplifier 100 from "burning" current unnecessarily. As illustrated in FIG. 2, it is recognized that devices M5 and M4 could be replaced with a feedback mechanism 200 positioned between the second device and the adjust signal 150. Referring to FIGS. 1 and 2, the device M3 allows the drive signal 160 to propagate through the SENSE_NODE 110 to OUT when the GATE_SIGNAL 130 is off. In summary, the apparatus of this circuit topology allows for the gathering of a lot of statistical information quickly and area efficiently, through a method of a voltage divider sensing scheme with adjustable inputs of signals and device widths.

The embodiments of the invention provide an apparatus, method, etc. for an efficient circuit and method to measure resistance thresholds. A sense amplifier (also referred to herein as "sense line driver") for an integrated circuit memory is provided, including a sense node that receives an experiment signal from an experiment structure. An output device is connected to the sense node, wherein the output device amplifies the experiment signal. As discussed above, the experimental structure includes a resistive experiment and an access device, wherein the resistive experiment can be anything intended to be an open or a short circuit. For example, two wires placed next to each other without a processing defect would look like an open, and with a processing defect would look like a short. Any combination of semiconductor processing levels, structures, or devices could be the resistive experiment.

The sense amplifier further includes a voltage divider connected to the sense node, wherein the voltage divider includes a first device and a second device. As discussed above, the first device and the second device combine to form a resistor 140 from the SENSE_NODE 110 to the supply voltage VDD. A sensing range is controlled by an operating width/resistance range and/or an adjust signal of the second device. As discussed above, the adjust signal can be connected to the second device M2, the third device M3, the fourth device M4, and the fifth device M5.

The adjust signal changes resistive properties (a gate to source voltage) of the second device and holds a constant voltage (typically between GND and VDD) over multiple sensing instances. For example, a width of 2 um on the second device M2 might trip at 10 kohms, whereas a width of 0.5 um might trip at 100 kohms. The adjust signal 150 can then move the trip points up and down as needed. Thus, the sensing range is different for each of the sensing instances due to a change in the operating width/resistance range of the second device M2.

Additionally, the sense amplifier includes a third device, a fourth device and a fifth device. Specifically, the third device is connected to the sense node and allows a drive signal connected to the first device and the third device to propagate through the sense node to the output device when a gate signal connected to the experiment structure is off. As discussed above, the drive signal could be connected to the first device M1 and the third device M3. The fourth device and the fifth device are connected to the adjust signal, wherein the fourth device and the fifth device latch the sense amplifier. As discussed above, this also keeps the sense amplifier from "burning" current.

A method is also provided for measuring resistance of an integrated circuit device using a sense line driver. The method begins by forming a voltage divider network that includes a first device and a second device. As discussed above, the first device M1 can be positioned between a supply voltage VDD and the second device M2, wherein the second device M2 is positioned between the first device M1 and the third device M3. A sensing range is controlled by an operating width/resistance range and/or an adjust signal of the second device. As discussed above, the adjust signal can be connected to the second device M2, the third device M3, the fourth device M4, and the fifth device M5.

The adjust signal is held at a constant voltage over multiple sensing instances, wherein the sensing range is differed for each of the sensing instances by changing the operating width/resistance range of the second device. The adjust signal can be changed, however, to change a gate to source voltage of the second device. For example, a width of 2 um on the second device M2 might trip at 10 kohms, whereas a width of 0.5 um might trip at 100 kohms. The adjust signal 150 can then move the trip points up and down as needed.

The method further includes propagating a drive signal to an output device when a gate signal connected to an experiment structure is off. As discussed above, the experimental structure includes a resistive experiment and an access device, wherein the resistive experiment can be anything intended to be an open or a short circuit. The method also latches the sense line driver via the fourth device M4 and the fifth device M5. As discussed above, the fourth device M4 can be positioned adjacent the second device M2, wherein the fifth device M5 is connected to the fourth device M4.

Figure 3:
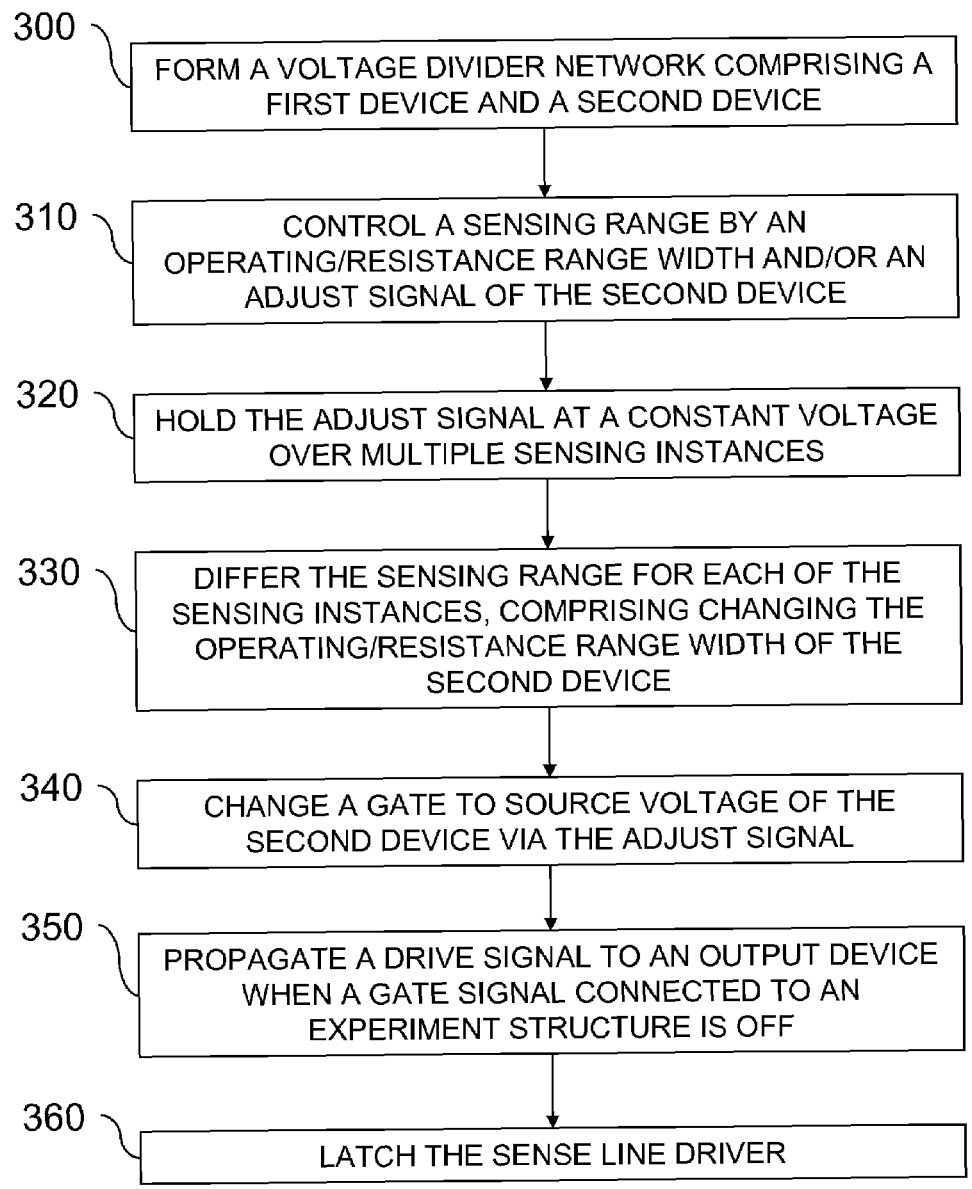
FIG. 3 is a flow diagram illustrating a method for a sense line driver for an integrated circuit memory.

FIG. 3 illustrates a flow diagram for a method of measuring resistance of an integrated circuit device using a sense line driver. The method begins in item 300 by forming a voltage divider network comprising a first device and a second device. As discussed above, the first device and the second device combine to form a resistor 140 from the SENSE_NODE 110 to the supply voltage VDD. Next in item 310, a sensing range is controlled by an operating width/resistance range and/or an adjust signal of the second device. As discussed above, the adjust signal can be connected to the second device M2, the third device M3, the fourth device M4, and the fifth device M5.

The adjust signal is held at a constant voltage over multiple sensing instances (item 320) and the sensing range is differed for each of the sensing instances by changing the operating width/resistance range of the second device (item 330). The adjust signal can be changed, however, to change a gate to source voltage of the second device (item 340). For example, a width of 2 um on the second device M2 might trip at 10 kohms, whereas a width of 0.5 um might trip at 100 kohms. The adjust signal 150 can then move the trip points up and down as needed.

Additionally, in item 350, a drive signal is propagated to an output device when a gate signal connected to an experiment structure is off. As discussed above, the drive signal could be connected to the first device M1 and the third device M3. Furthermore, in item 360, the method latches the sense line driver. As discussed above, this also keeps the sense amplifier from "burning" current.

Accordingly, the embodiments of the invention provide a sense amplifier based on a voltage divider scheme, which replaces typical differential amplifier circuits that normally give great detailed information after significant design, test, and manufacturing effort. This circuit is an efficient way to acquire a large amount of information quickly, particularly statistical, over a wide range of resistances due to the width of the second transistor device, and therefore the voltage divider of the first transistor device-second transistor device and the access device-experiment device.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments of the invention have been described in terms of preferred embodiments, those skilled in the art will recognize that the embodiments of the invention can be practiced with modification within the spirit and scope of the appended claims.

What is claimed is:

1. A sense amplifier for an integrated circuit memory, comprising:
   a voltage divider network from a sense node to a supply voltage, comprising a first device and a second device, wherein a sensing range of said sense amplifier is controlled by at least one of an operating width of said second device and an adjust signal of said second device;
   a third device adapted to allow a drive signal to propagate to an output device when a gate signal connected to an experiment structure is off; and
   a fourth device and a fifth device, wherein said fourth device and said fifth device are adapted to latch said sense amplifier.

2. The sense amplifier according to claim 1, wherein said adjust signal is adapted to hold a constant voltage over multiple sensing instances.

3. The sense amplifier according to claim 1, wherein said adjust signal is adapted to change resistive properties of said second device.

4. The sense amplifier according to claim 2, wherein said sensing range is different for each of said sensing instances due to a change in said operating width of said second device.

5. A sense amplifier for an integrated circuit memory, comprising:
   a voltage divider network from a sense node to a supply voltage comprising a first device and a second device, wherein a sensing range of said sense amplifier is controlled by at least one of a resistance range of said second device and an adjust signal of said second device;

a third device adapted to allow a drive signal to propagate to an output device when a gate signal connected to an experiment structure is off; and a fourth device and a fifth device, wherein said fourth device and said fifth device are adapted to latch said sense amplifier.

6. The sense amplifier according to claim 5, wherein said adjust signal is adapted to hold a constant voltage over multiple sensing instances.

7. The sense amplifier according to claim 5, wherein said adjust signal is adapted to change a gate to source voltage of said second device.

8. The sense amplifier according to claim 6, wherein said sensing range is different for each of said sensing instances due to a change in said resistance range of said second device.

9. A sense line driver for an integrate circuit, comprising:
a sense node adapted to receive an experiment signal from an experiment structure;
an output device connected to said sense node, wherein said output device is adapted to amplify said experiment signal; and
a voltage divider connected from said sense node to a supply voltage, to said sense node, wherein said voltage divider comprises a first device and a second device, and wherein a sensing range of said sense line driver is controlled by at least one of an operating width of said second device and an adjust signal of said second device.

10. The sense line driver according to claim 9, wherein said adjust signal is adapted to hold a constant voltage over multiple sensing instances.

11. The sense line driver according to claim 9, wherein said adjust signal is adapted to change a gate to source voltage of said second device.

12. The sense line driver according to claim 9, further comprising:

a third device connected to said sense node, wherein said third device is adapted to allow a drive signal connected to said first device and said third device to propagate through said sense node to said output device when a gate signal connected to said experiment structure is off; and a fourth device and a fifth device connected to said adjust signal, wherein said fourth device and said fifth device are adapted to latch said sense line driver.

13. The sense line driver according to claim 10, wherein said sensing range is different for each of said sensing instances due to a change in said operating width of said second device.

14. A method of measuring resistance of an integrated circuit device using a sense line driver, comprising:
forming a voltage divider network from a sense node to a supply voltage, comprising a first device and a second device; and
controlling a sensing range of said sense line driver by at least one of an operating width of said second device and an adjust signal of said second device;
propagating a drive signal to an output device when a gate signal connected to an experiment structure is off; and
latching said sense line driver.

15. The method according to claim 14, further comprising holding said adjust signal at a constant voltage over multiple sensing instances.

16. The method according to claim 14, further comprising changing a gate to source voltage of said second device via said adjust signal.

17. The method according to claim 15, further comprising differing said sensing range for each of said sensing instances, comprising changing said operating width of said second device.

* * * * *